United States Patent
Shiokawa

(10) Patent No.: US 11,239,411 B2
(45) Date of Patent: Feb. 1, 2022

(54) SPIN-ORBIT-TORQUE MAGNETIZATION ROTATIONAL ELEMENT, SPIN-ORBIT-TORQUE MAGNETORESISTANCE EFFECT ELEMENT, MAGNETIC MEMORY, AND OSCILLATOR

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/292,798

(22) Filed: Mar. 5, 2019

(65) Prior Publication Data
US 2019/0288185 A1 Sep. 19, 2019

(30) Foreign Application Priority Data
Mar. 16, 2018 (JP) .............................. JP2018-049768

(51) Int. Cl.
| | |
|---|---|
| *H01L 43/02* | (2006.01) |
| *H01L 43/10* | (2006.01) |
| *H01L 27/22* | (2006.01) |
| *G11C 11/16* | (2006.01) |

(Continued)

(52) U.S. Cl.
CPC ............ *H01L 43/02* (2013.01); *G11C 11/161* (2013.01); *H01F 10/3254* (2013.01); *H01F 10/3272* (2013.01); *H01L 27/222* (2013.01); *H01L 43/10* (2013.01); *G11C 11/1673* (2013.01); *G11C 11/1675* (2013.01); *H01F 10/329* (2013.01); *H01L 43/12* (2013.01)

(58) Field of Classification Search
CPC . H01F 10/3272; H01F 10/3254; H01L 43/02; G11C 11/161; G11C 11/18
See application file for complete search history.

(56) References Cited

U.S. PATENT DOCUMENTS

| 8,350,347 B2 | 1/2013 | Gaudin et al. |
| 9,953,692 B1 * | 4/2018 | Mihajlovic ........... G11C 11/161 |
| 2015/0348606 A1 | 12/2015 | Buhrman et al. |

(Continued)

FOREIGN PATENT DOCUMENTS

| JP | 2007-299931 A | 11/2007 |
| JP | 2017-59679 A | 3/2017 |

(Continued)

OTHER PUBLICATIONS

Ran Cheng et al. "Ultrafast Switching of Antiferromagnets Via Spin-Transfer Torque". Physical Review B, vol. 91, 2015, pp. 064423-1 through 064423-5.

(Continued)

*Primary Examiner* — Sarah K Salerno
(74) *Attorney, Agent, or Firm* — Oliff PLC

(57) ABSTRACT

A spin-orbit-torque magnetization rotational element includes: a spin-orbit-torque wiring extending in a first direction; an antiferromagnetic layer laminated on one surface of the spin-orbit-torque wiring; and a first ferromagnetic layer located on a side of the antiferromagnetic layer opposite to the spin-orbit-torque wiring and magnetically coupled with the antiferromagnetic layer by exchange coupling, wherein a length of the antiferromagnetic layer in the first direction is shorter than a length of the spin-orbit-torque wiring in the first direction.

20 Claims, 3 Drawing Sheets

(51) Int. Cl.
  *H01F 10/32* (2006.01)
  *H01L 43/12* (2006.01)

(56) References Cited

U.S. PATENT DOCUMENTS

| | | | |
|---|---|---|---|
| 2016/0300999 A1* | 10/2016 | Yi | G11C 11/1675 |
| 2017/0077177 A1 | 3/2017 | Shimomura et al. | |
| 2017/0077394 A1 | 3/2017 | Saida | |
| 2017/0179372 A1* | 6/2017 | Braganca | H01L 43/02 |
| 2017/0222135 A1 | 8/2017 | Fukami et al. | |
| 2017/0316813 A1 | 11/2017 | Lee et al. | |
| 2017/0372761 A1* | 12/2017 | Lee | H01L 27/228 |
| 2019/0305216 A1* | 10/2019 | Gosavi | H01L 43/02 |
| 2020/0212291 A1* | 7/2020 | Lin | H01F 10/3218 |

FOREIGN PATENT DOCUMENTS

| | | |
|---|---|---|
| JP | 2017-059690 A | 3/2017 |
| WO | 2016/021468 A1 | 2/2016 |

OTHER PUBLICATIONS

Y.K. Kato et al. "Observation of the Spin Hall Effect in Semiconductors". Science Magazine, vol. 306, Dec. 10, 2004, pp. 1910-1913.
Ioan Mihai Miron et al. "Perpendicular Switching of a Single Ferromagnetic Layer Induced By In-Plane Current Injection". Nature, vol. 476, Aug. 11, 2011, pp. 189-194.
Luqiao Liu et al. "Spin Torque Switching With the Giant Spin Hall Effect of Tantalum". Science Magazine, vol. 336, 2012, 555, 19 pages with 12 pages of Supporting Online Materials.
Luqiao Liu et al. "Current-Induced Switching of Perpendicularly Magnetized Magnetic Layers Using Spin Torque From the Spin Hall Effect". Physical Review Letters, vol. 109, Aug. 31, 2012, pp. 096602-1 through 096602-5.
Ki-Seung Lee et al. "Threshold Current for Switching of a Perpendicular Magnetic Layer Induced By Spin Hall Effect". Applied Physics Letters, vol. 102, 2013, 112410, 17 pages.
Ki-Seung Lee et al. "Thermally Activated Switching of Perpendicular Magnet By Spin-Orbit Spin Torque". Applied Physics Letters, vol. 104, 2014, pp. 072413-1 through 072413-5.
Shunsuke Fukami et al. "Magnetization Switching By Spin-Orbit Torque in an Antiferromagnet-Ferromagnet Bilayer System". Nature Materials, vol. 15, May 2016, pp. 535-542.
S. Fukami et al. "A Spin-Orbit Torque Switching Scheme With Collinear Magnetic Easy Axis and Current Configuration". Nature Nanotechnology, vol. 11, 2016, 621, 6 pages.
S. Takahashi et al. "Spin Injection and Detection in Magnetic Nanostructures". Physical Review B, vol. 67, 2003, pp. 052409-1 through 052409-4.
Yeongkyo Seo et al. "Area-Efficient SOT-MRAM With a Schottky Diode". IEEE Electron Device Letters, vol. 37, No. 8, Aug. 2016, pp. 982-985.
Wei Zhang et al. "Spin Hall Effects in Metallic Antiferromagnets". Physical Review Letters, vol. 113, 2014, pp. 196602-1 through 196602-6.

* cited by examiner

SPIN-ORBIT-TORQUE MAGNETIZATION ROTATIONAL ELEMENT, SPIN-ORBIT-TORQUE MAGNETORESISTANCE EFFECT ELEMENT, MAGNETIC MEMORY, AND OSCILLATOR

BACKGROUND

The present disclosure relates to a spin-orbit-torque magnetization rotational element, a spin-orbit-torque magnetoresistance effect element, a magnetic memory, and an oscillator.

Priority is claimed on Japanese Patent Application No. 2018-049768 filed in Japan on Mar. 16, 2018, the content of which is incorporated by reference.

DESCRIPTION OF RELATED ART

A giant magnetoresistance (GMR) element made up of a multilayered film having a ferromagnetic layer and a nonmagnetic layer, and a tunneling magnetoresistance (TMR) element using an insulating layer (a tunnel barrier layer, a barrier layer) for a nonmagnetic layer are known as a magnetoresistance effect element. In comparison with a GMR element, a TMR element generally has higher element resistance, and a greater magnetoresistance (MR) ratio. Attention is focused upon TMR elements as elements for a magnetic sensor, a high-frequency component, a magnetic head, and a non-volatile random-access memory (e.g., an MRAM).

An MRAM reads and writes data using a characteristic that the element resistance of the TMR element changes when magnetization directions of two ferromagnetic layers between which an insulating layer is sandwiched are changed. As a writing mode of an MRAM, a mode of performing writing (magnetization reversal) using a magnetic field generated by a current, and a mode of performing writing (magnetization reversal) using a spin-transfer torque (STT) generated by applying a current in a lamination direction of a magnetoresistance effect element are known.

The magnetization reversal of a TMR element using an STT is efficient from the viewpoint of energy efficiency, but there is a need to apply the current in the lamination direction of the magnetoresistance effect element when data is written. The writing current may cause deterioration in characteristics of the magnetoresistance effect element.

Therefore, attention has recently been focused upon magnetization reversal using a spin-orbit torque (SOT) caused by a pure spin current generated by a spin-orbit interaction that performs magnetization reversal through a mechanism different from an STT. An SOT is induced by a pure spin current generated by a spin-orbit interaction or the Rashba effect at an interface with a heterogeneous material. A current for inducing an SOT in a magnetoresistance effect element flows in a direction that intersects the lamination direction of the magnetoresistance effect element. That is, there is no need to cause a current to flow in the lamination direction of the magnetoresistance effect element, and thus the lifespan of the magnetoresistance effect element longer is expected to be longer.

An element using a lamination wiring on which a ferromagnetic substance and an antiferromagnetic substance are laminated as a wiring for generating a spin current is disclosed in United States Patent Application, Publication No. 2017/0316813. It is disclosed in United States Patent Application, Publication No. 2017/0316813 that a structure of an interior of the wiring is made asymmetrical, thereby enabling magnetization reversal under no magnetic field.

Meanwhile, attention has recently been focused upon a behavior of the magnetization of an antiferromagnetic substance (e.g., Ran Cheng, Matthew W. Daniels, Jian-Gang Zhu, and Di Xiao. Physical Review B 91, 064423 (2015)). It is said that high-speed magnetization reversal of the magnetization of an antiferromagnetic substance is possible. It is said that a time of about 1 nsec is required for the magnetization reversal of the magnetization in a ferromagnetic substance, whereas it is said that the magnetization reversal of the magnetization in an antiferromagnetic substance may be performed in about 10 psec.

SUMMARY

However, in the element disclosed in United States Patent Application, Publication No. 2017/0316813, the ferromagnetic substance and the antiferromagnetic substance are used as a source of the spin current. It is difficult for the ferromagnetic substance and the antiferromagnetic substance to produce a large spin current, and they are not suitable as the source of the spin current. That is, even if the structure of the interior of the wiring is made asymmetrical, a torque (a spin-orbit torque) inducing the magnetization reversal cannot be efficiently applied to the magnetization of a free layer. Further, even at a point in time other than the time of writing, a magnetic field produced by the ferromagnetic substance constituting the wiring acts on the free layer, and an orientation direction of the magnetization of the free layer is inclined. Since a magnetoresistance effect is caused by a difference in a relative angle between a fixed layer and a free layer, an MR ratio of the magnetoresistance effect element is reduced. Furthermore, the magnetic field produced by the ferromagnetic substance constituting the wiring also reduces the stability of the magnetization of the free layer. When the stability of the magnetization of the free layer is reduced, there is concern of data being rewritten by unexpected magnetization reversal.

The present disclosure has been realized in view of the above circumstances, and an object of the present disclosure is to provide a spin-orbit-torque magnetization rotational element, a spin-orbit-torque magnetoresistance effect element, and a magnetic memory in which a reaction speed of magnetization rotation is fast.

To solve the problems, the present disclosure provides the following means.

(1) A spin-orbit-torque magnetization rotational element according to a first aspect includes: a spin-orbit-torque wiring extending in a first direction; an antiferromagnetic layer laminated on one surface of the spin-orbit-torque wiring; and a first ferromagnetic layer located on a side of the antiferromagnetic layer opposite to the spin-orbit-torque wiring and magnetically coupled with the antiferromagnetic layer by exchange coupling, wherein a length of the antiferromagnetic layer in the first direction is shorter than a length of the spin-orbit-torque wiring in the first direction.

(2) In the spin-orbit-torque magnetization rotational element according to the above aspect, an easy axis of magnetization of the first ferromagnetic layer may be an in-plane direction; and magnetizations of the antiferromagnetic layer and magnetization of the first ferromagnetic layer may exhibit exchange anisotropy in the in-plane direction.

(3) In the spin-orbit-torque magnetization rotational element according to the above aspect, an easy axis of magnetization of the first ferromagnetic layer may be a lamination direction; and magnetizations of the antiferromagnetic layer and magnetization of the first ferromagnetic layer may exhibit exchange anisotropy in the lamination direction.

(4) In the spin-orbit-torque magnetization rotational element according to the above aspect, portions of the magnetization of the antiferromagnetic layer may be oriented in the in-plane direction and the lamination direction in a state where no external force is applied.

(5) In the spin-orbit-torque magnetization rotational element according to the above aspect, the antiferromagnetic layer may include any one selected from the group consisting of IrMn, PtMn, FeMn, and PdMn.

(6) In the spin-orbit-torque magnetization rotational element according to the above aspect, a film thickness of the antiferromagnetic layer may be less than or equal to twice a spin diffusion length of the antiferromagnetic layer.

(7) In the spin-orbit-torque magnetization rotational element according to the above aspect, the spin-orbit-torque wiring may include a nonmagnetic metal whose atomic number is greater than or equal to atomic number 39 with d and f electrons in an outermost shell.

(8) A spin-orbit-torque magnetoresistance effect element according to a second aspect includes: the spin-orbit-torque magnetization rotational element according to the above aspect; a second ferromagnetic layer configured to face the first ferromagnetic layer; and a nonmagnetic layer located between the first ferromagnetic layer and the second ferromagnetic layer.

(9) A magnetic memory according to a third aspect includes a plurality of spin-orbit-torque magnetoresistance effect elements, each of which is the spin-orbit-torque magnetoresistance effect element according to the above aspect.

(10) An oscillator according to a fourth aspect includes the spin-orbit-torque magnetization rotational element according to the above aspect.

According to the spin-orbit-torque magnetization rotational elements of the aspects, a time required for magnetization rotation can be shortened.

DETAILED DESCRIPTION

Hereinafter, the present embodiments will be described in detail with appropriate reference to the drawings. The drawings used in the following description may illustrate characteristic portions in an enlarged size for the sake of convenience to facilitate understanding of features, and dimensional ratios in and between constituent elements may be different from actual dimensional ratios. Materials, dimensions, etc. exemplified in the following description are examples, and the present disclosure is not limited thereto, and may be appropriately modified and implemented without departing from the scope in which effects of the present disclosure are exhibited.

First Embodiment (Spin-Orbit-Torque Magnetization Rotational Element)

Figure 1:
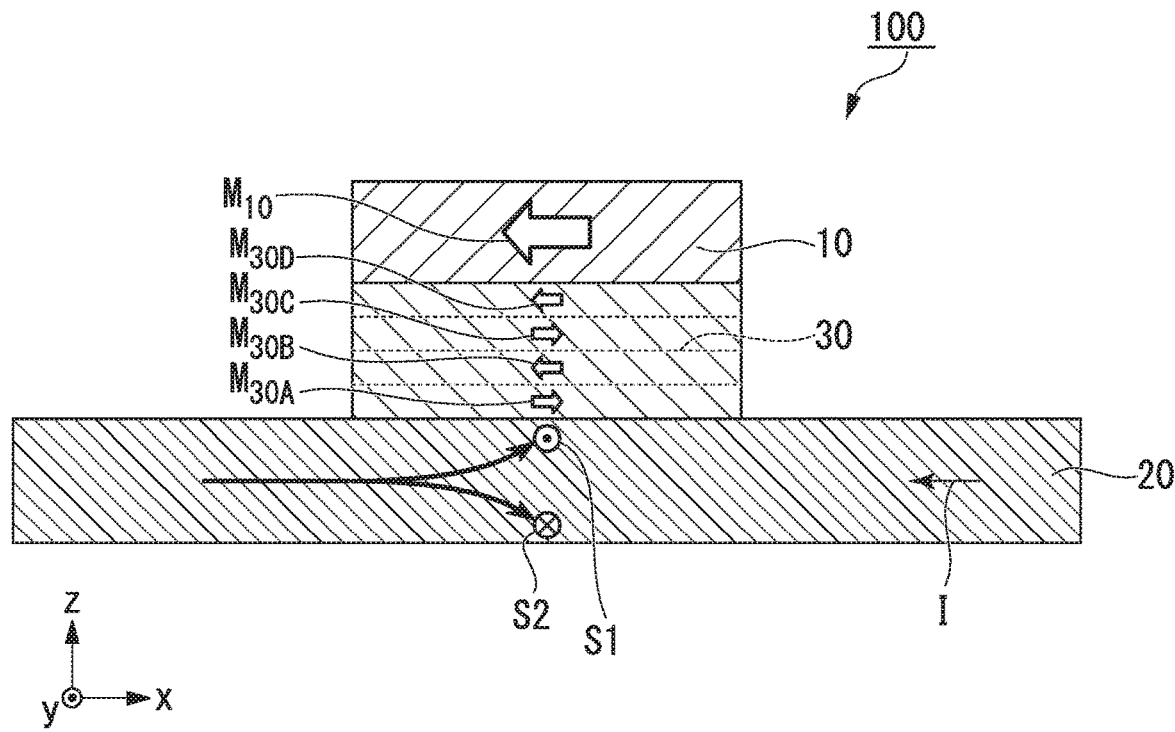
FIG. 1 is a schematic sectional view illustrating a spin-orbit-torque magnetization rotational element according to a first embodiment.

FIG. 1 is a sectional view schematically illustrating a spin-orbit-torque magnetization rotational element according to a first embodiment. The spin-orbit-torque magnetization rotational element 100 illustrated in FIG. 1 includes a first ferromagnetic layer 10, a spin-orbit-torque wiring 20, and an antiferromagnetic layer 30. The antiferromagnetic layer 30 is laminated on one surface of the spin-orbit-torque wiring 20. The first ferromagnetic layer 10 is located on a side of the antiferromagnetic layer 30 opposite to the spin-orbit-torque wiring 20.

Hereinafter, a description will be made by prescribing that a first direction in which the spin-orbit-torque wiring 20 extends is an x direction, that a direction orthogonal to the first direction in a plane where the spin-orbit-torque wiring 20 is present is a y direction, and a direction orthogonal to both the x direction and the y direction is a z direction. In FIG. 1, the z direction corresponds to lamination directions of the first ferromagnetic layer 10 and the antiferromagnetic layer 30, and a thickness direction of the spin-orbit-torque wiring 20.

<First Ferromagnetic Layer>

The first ferromagnetic layer 10 functions by a change in a direction of magnetization $M_{10}$. An easy axis of magnetization of the first ferromagnetic layer 10 illustrated in FIG. 1 is an in-plane direction, and the first ferromagnetic layer 10 is an in-plane magnetization film on which the magnetization $M_{10}$ is oriented in the x direction.

A ferromagnetic material, particularly a soft magnetic material can be applied for the first ferromagnetic layer 10. For example, a metal selected from the group consisting of Cr, Mn, Co, Fe, and Ni, an alloy including one or more of these metals, an alloy including these metals and at least one or more of B, C, and N, or the like can be used. To be specific, Co—Fe, Co—Fe—B, and Ni—Fe can be given as an example.

Further, a Heusler alloy such as $Co_2FeSi$ may be used for the first ferromagnetic layer 10. A Heusler alloy includes an intermetallic compound having a chemical composition of XYZ or $X_2YZ$ where X is a transition metal element or a noble metal element from the Co, Fe, Ni, or Cu groups in the periodic table, Y is a transition metal from the Mn, V, Cr, or Ti groups, or the same type of element as for X, and Z is a representative element from Group III to Group V. For example, Heusler alloys include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and so on. A Heusler alloy has a high spin polarization.

<Spin-Orbit-Torque Wiring>

The spin-orbit-torque wiring 20 extends in the x direction. The first ferromagnetic layer 10 and the antiferromagnetic layer 30 are located on one surface of the spin-orbit-torque wiring 20 in the z direction.

When a current flows, the spin-orbit-torque wiring 20 produces a spin current due to a spin Hall effect. The spin Hall effect is a phenomenon that, when a current is caused to flow to a wiring, a spin current is induced in a direction orthogonal to a direction of the current on the basis of a spin-orbit interaction. A mechanism in which the spin current is produced by the spin Hall effect will be described.

As illustrated in FIG. 1, when a potential difference is applied across the spin-orbit-torque wiring 20 in the x direction, a current I flows in the x direction. When the current I flows, a first spin S1 oriented in the y direction and a second spin S2 oriented in a −y direction are bent in directions orthogonal thereto. An ordinary Hall effect and a spin Hall effect are the same as each other in that a direction of motion (movement) of charges (electrons) that are in motion (moving) can be bent, but they are greatly different from each other in that, in the ordinary Hall effect, charged particles that are in motion in a magnetic field receive a Lorentz force such that a direction of motion thereof can be bent, whereas, in the spin Hall effect, since there is no magnetic field, electrons simply move (a current simply flows), and a direction of motion is bent.

In a nonmagnetic substance (a material that is not a ferromagnetic substance), since the number of electrons of the first spin Si is equal to that of the second spin S2, the number of electrons of the first spin S1 directed in an upward direction in the figure is equal to that of the second spin S2 directed in a downward direction. For this reason, a current as a net flow of charges is zero. A spin current that is not accompanied by this current is particularly called a pure spin current.

Here, when a flow of the electrons of the first spin S1 is expressed by $J_\uparrow$, a flow of the electrons of the second spin S2 is expressed by $J_\downarrow$, and a spin current is expressed by $J_S$, the spin current is defined as $J_S=J_\uparrow-J_\downarrow$. In FIG. 1, $J_S$ expressing the pure spin current flows in the z direction in the figure. Here, $J_S$ is a flow of electrons whose polarization is 100%. When the antiferromagnetic layer 30 comes into contact with an upper surface of the spin-orbit-torque wiring 20, a pure spin current flows into the antiferromagnetic layer 30 by diffusion. That is, a spin is injected into the antiferromagnetic layer 30.

The spin-orbit-torque wiring 20 is formed of any of a metal, an alloy, an intermetallic compound, a metal boride, a metal carbide, a metal silicide, and a metal phosphide that function to generate a spin current due to a spin Hall effect when a current flows.

A main component of the spin-orbit-torque wiring 20 is preferably a nonmagnetic heavy metal. Here, a heavy metal refers to a metal having a specific gravity greater than that of yttrium. The nonmagnetic heavy metal is preferably a nonmagnetic metal whose atomic number is greater than or equal to atomic number 39 with d and f electrons in the outermost shell. The nonmagnetic metal has a strong spin-orbit interaction by which a spin Hall effect is generated.

Generally, the electrons move opposite to a current regardless of a direction of the spin thereof. In contrast, a nonmagnetic metal having a high atomic number with d and f electrons in the outermost shell has a strong spin-orbit interaction, and a spin Hall effect acts strongly. For this reason, the moving direction of the electrons depends on the direction of the spin of the electrons. Therefore, the spin current $J_S$ easily occurs in a nonmagnetic heavy metal.

Further, the spin-orbit-torque wiring 20 may include a magnetic metal. A magnetic metal refers to a ferromagnetic metal or an antiferromagnetic metal. When a minute amount of a magnetic metal is included in a nonmagnetic metal, it becomes a cause of scattering of the spin. When the spin is scattered, a spin-orbit interaction is enhanced, and the efficiency of generation of a spin current with respect to a current is raised.

On the other hand, when an added amount of the magnetic metal increases excessively, the generated spin current is scattered by the added magnetic metal. As a result, an action by which the spin current is reduced sometimes becomes stronger. For this reason, a molar ratio of the added magnetic metal is preferably sufficiently smaller than a total molar ratio of the elements of which the spin-orbit-torque wiring is composed. The molar ratio of the added magnetic metal is preferably less than or equal to 3% of the total.

The spin-orbit-torque wiring 20 may include a topological insulator. A topological insulator is a material whose interior is an insulator or a high resistance substance but on a surface of which a spin-polarized metal state occurs. An internal magnetic field occurs in this material due to a spin-orbit interaction. Therefore, even if there is no external magnetic field, a new topological phase is generated by an effect of the spin-orbit interaction. This is a topological insulator, and a pure spin current can be generated with high efficiency by a strong spin-orbit interaction and breaking of reversal symmetry at an edge.

Preferably, the topological insulator is, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like. These topological insulators can generate a spin current with high efficiency.

<Antiferromagnetic Layer>

The antiferromagnetic layer 30 is located between the first ferromagnetic layer 10 and the spin-orbit-torque wiring 20. The antiferromagnetic layer 30 may be directly connected to the spin-orbit-torque wiring 20 or be indirectly connected thereto via another layer.

In the antiferromagnetic layer 30, spins adjacent to each other in a lamination direction are arranged antiparallel to each other. In the antiferromagnetic layer 30 illustrated in FIG. 1, magnetization $M_{30A}$ and magnetization $M_{30B}$, magnetization $M_{30B}$ and magnetization $M_{30C}$, and magnetization $M_{30C}$ and magnetization $M_{30D}$ are arranged antiparallel to each other.

The antiferromagnetic layer 30 is magnetically coupled to the first ferromagnetic layer 10 by exchange coupling. In FIG. 1, the antiferromagnetic layer 30 exhibits exchange anisotropy in an in-plane direction along with the first ferromagnetic layer 10. Exchange anisotropy is a kind of interface magnetic anisotropy that occurs between the first ferromagnetic layer 10 and the antiferromagnetic layer 30. The magnetization $M_{10}$ of the first ferromagnetic layer 10 is affected by the antiferromagnetic layer 30, and exhibits a behavior different from a case of the first ferromagnetic layer 10 alone.

A well-known antiferromagnetic substance is used for the antiferromagnetic layer 30. The antiferromagnetic layer 30 preferably includes any one selected from the group consisting of IrMn, PtMn, FeMn, and PdMn. The antiferromagnetic layer 30 formed of these materials exhibits sufficient exchange anisotropy.

A length of the antiferromagnetic layer 30 in the x direction is shorter than a length of the spin-orbit-torque wiring 20 in the x direction. That is, the current I mainly flows along the spin-orbit-torque wiring 20. In other words, a main source of the spin current in the spin-orbit-torque magnetization rotational element 100 is the spin-orbit-torque wiring 20. Since the main source of the spin current is used as the spin-orbit-torque wiring 20, the spin current can thereby be efficiently generated.

A function of the antiferromagnetic layer 30 in the spin-orbit-torque magnetization rotational element 100 is divided depending on whether or not the antiferromagnetic layer 30 is a conductor and how thick a film thickness of the antiferromagnetic layer 30 is.

In a case where the film thickness of the antiferromagnetic layer 30 is sufficiently thick and the antiferromagnetic layer 30 is not a conductor, the antiferromagnetic layer 30 exhibits a first function of transmitting information about the spin injected from the spin-orbit-torque wiring 20 to the first ferromagnetic layer 10. "The film thickness of the antiferromagnetic layer 30 is sufficiently thick" means that the film thickness of the antiferromagnetic layer 30 is thicker than twice a spin diffusion length of the antiferromagnetic layer 30. The spin diffusion length of the antiferromagnetic layer 30 also differs according to a type of material of which the antiferromagnetic layer 30 is formed, but it is approximately 2 nm.

The first spin S1 injected from the spin-orbit-torque wiring 20 rotates the magnetization $M_{30A}$ of the antiferromagnetic layer 30 which is closest to the spin-orbit-torque wiring 20. The magnetization $M_{30A}$ applies a torque in the +y direction to the magnetization $M_{30A}$. When a sufficient torque is applied to the magnetization $M_{30A}$, the magnetization $M_{30A}$ is subjected to magnetization reversal. When the magnetization $M_{30A}$ is subjected to magnetization reversal, the magnetization $M_{30B}$ is also subjected to magnetization reversal. The magnetization reversal of the magnetization $M_{30B}$ is transmitted to the magnetization $M_{30C}$, and the magnetization reversal of the magnetization $M_{30C}$ is transmitted to the magnetization $M_{30D}$.

The antiferromagnetic layer 30 and the first ferromagnetic layer 10 are magnetically coupled by exchange coupling. When the magnetization $M_{30D}$ of the antiferromagnetic layer 30 is subjected to magnetization reversal, a force for attempting to make the magnetization $M_{10}$ of the first ferromagnetic layer 10 subjected to magnetization reversal due to magnetic coupling is applied.

A reaction speed of magnetization rotation of the antiferromagnetic layer 30 is faster than a reaction speed of magnetization rotation of the ferromagnetic substance. The magnetization of the antiferromagnetic layer 30 is rotated by the spin injected from the spin-orbit-torque wiring 20, and information thereabout is transmitted to the first ferromagnetic layer 10. Thereby, the magnetization of the first ferromagnetic layer 10 can be rotated at a high speed.

When the film thickness of the antiferromagnetic layer 30 is thick, an exchange coupling magnetic field occurs at the antiferromagnetic layer 30. When the exchange coupling magnetic field occurs, coupling between the neighboring magnetizations $M_{30A}$, $M_{30B}$, $M_{30C}$, and $M_{30D}$ becomes strong, and the first function is more strongly exhibited. In a case where the antiferromagnetic layer 30 is a Pt—Mn alloy, an exchange coupling magnetic field occurs when the thickness of the antiferromagnetic layer 30 is thicker than or equal to 7 nm. In a case where the antiferromagnetic layer 30 is an Ir—Mn alloy, an exchange coupling magnetic field occurs when the thickness of the antiferromagnetic layer 30 is thicker than or equal to 6 nm.

Next, in a case where the film thickness of the antiferromagnetic layer 30 is thin and the antiferromagnetic layer 30 is not a conductor, the antiferromagnetic layer 30 exhibits a second function of allowing the spin injected from the spin-orbit-torque wiring 20 to pass through the first ferromagnetic layer 10 in addition to the first function. "The film thickness of the antiferromagnetic layer 30 is thin" means that the film thickness of the antiferromagnetic layer 30 is thinner than or equal to twice the spin diffusion length of the antiferromagnetic layer 30.

When the film thickness of the antiferromagnetic layer 30 is thin, the first spin S1 injected from the spin-orbit-torque wiring 20 passes through the antiferromagnetic layer 30, and is injected into the antiferromagnetic layer 30 with no change. The magnetization $M_{10}$ of the first ferromagnetic layer 10 receives a torque (a torque generated by the first function) given by magnetic coupling to the antiferromagnetic layer 30 and a torque (a torque generated by the second function) given by the first spin Si injected from the spin-orbit-torque wiring 20.

When the film thickness of the antiferromagnetic layer 30 is thin, an exchange coupling magnetic field does not occur at the antiferromagnetic layer 30. However, exchange coupling occurs at the interior of the antiferromagnetic layer 30 and at an interface between the antiferromagnetic layer 30 and the first ferromagnetic layer 10. That is, in comparison with the case where the film thickness of the antiferromagnetic layer 30 is thick, the torque generated by the first function becomes small, but the torque generated by the first function acts on the magnetization $M_{10}$ of the first ferromagnetic layer 10.

The reaction speed of magnetization rotation of the antiferromagnetic layer 30 is faster than the reaction speed of magnetization rotation of the ferromagnetic substance. The torque generated by the first function acts on the magnetization $M_{10}$ in advance of the torque generated by the second function. When timing of action of a torque differs, the magnetization $M_{10}$ causes the torque generated by the first function to trigger magnetization rotation, and causes the torque generated by the second function to complete the magnetization rotation. The torque generated by the first function assists the magnetization rotation of the magnetization $M_{10}$ caused by the torque generated by the second function.

Further, in a case where the film thickness of the antiferromagnetic layer 30 is thin and the antiferromagnetic layer 30 is a conductor, the antiferromagnetic layer 30 exhibits a third function of the antiferromagnetic layer 30 itself producing a spin current, in addition to the first and second functions.

In the case where the antiferromagnetic layer 30 is the conductor, a part of the current I is distributed into the antiferromagnetic layer 30. In this case, the antiferromagnetic layer 30 also produces a spin current. Even in this case, the spin-orbit-torque wiring 20 having a length enough to produce spin polarization in the x direction is a main source of the spin current.

The magnetization $M_{10}$ of the first ferromagnetic layer 10 receives the torque (the torque generated by the first function) given by the magnetic coupling to the antiferromagnetic layer 30, the torque (the torque generated by the second function) given by the first spin S1 injected from the spin-orbit-torque wiring 20, and a torque (a torque generated by the third function) given by the spin injected from the antiferromagnetic layer 30.

Finally, in a case where the film thickness of the antiferromagnetic layer 30 is thick and the antiferromagnetic layer 30 is a conductor, a large spin current can also be produced at the antiferromagnetic layer 30.

As described above, the spin-orbit-torque magnetization rotational element 100 according to the present embodiment includes the antiferromagnetic layer 30 between the first ferromagnetic layer 10 and the spin-orbit-torque wiring 20. Since the spin-orbit-torque magnetization rotational element 100 includes the antiferromagnetic layer 30, the torque associated with the aforementioned first function can be applied to the magnetization $M_{10}$, and reduce a time required for magnetization rotation. The magnetization rotation of the magnetization $M_{10}$ can be assisted by the torque associated with the first function.

<Manufacturing Method>

An example of a manufacturing method of the spin-orbit-torque magnetization rotational element 100 will be described. First, a layer underlying a spin-orbit-torque wiring is laminated on a substrate (not shown). A well-known method such as a sputtering method, a chemical vapor deposition (CVD) or the like may be used as a laminating method.

Next, the layer underlying the spin-orbit-torque wiring is processed into the spin-orbit-torque wiring 20 using technology such as photolithography. An insulating layer is coated to surround the circumference of the spin-orbit-torque wiring 20. An oxide layer, a nitride layer, or the like can be used for the insulating layer.

Next, surfaces of the insulating layer and the spin-orbit-torque wiring are planarized by chemical mechanical polishing (CMP). A layer underlying the antiferromagnetic layer 30 and a layer underlying the first ferromagnetic layer 10 are laminated on the planarized surfaces. Finally, by processing the laminated films using technology such as photolithography, the spin-orbit-torque magnetization rotational element 100 is obtained.

So far, the spin-orbit-torque magnetization rotational element 100 is given as an example on the basis of FIG. 1 by way of example. The constitution of the spin-orbit-torque magnetization rotational element can be modified and changed in various ways without departing from the gist of the present disclosure defined by the claims.

Figure 2:
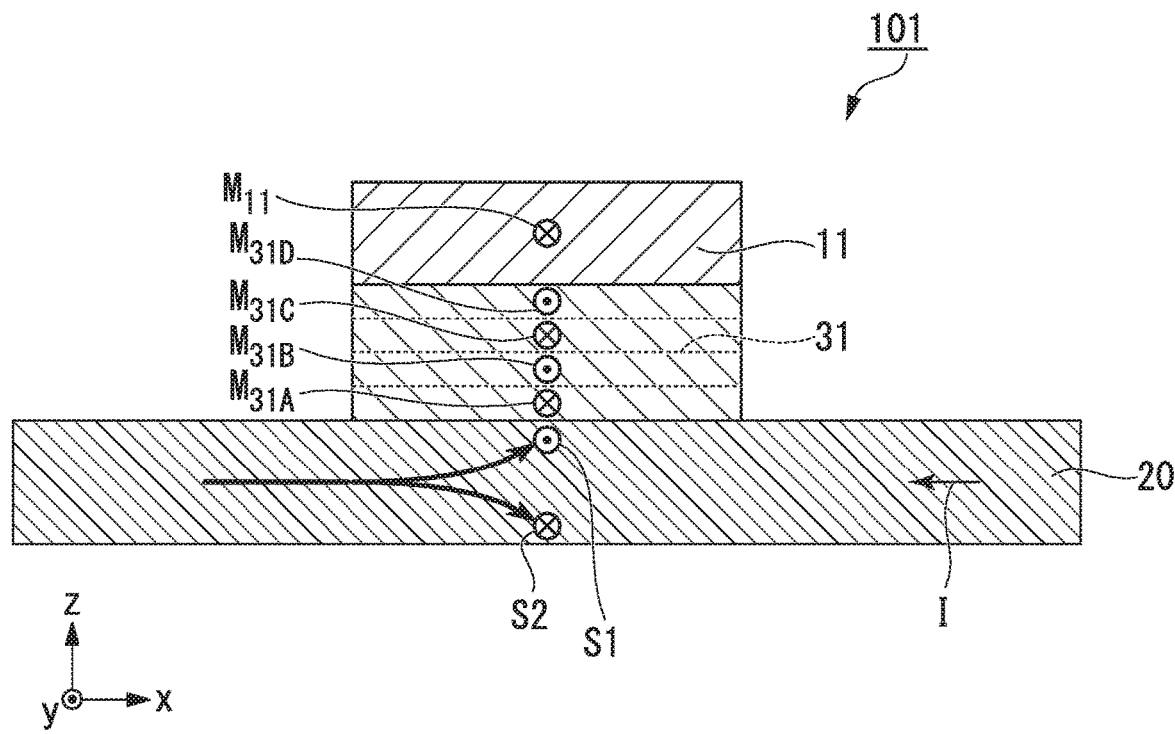
FIG. 2 is a schematic sectional view illustrating another example of the spin-orbit-torque magnetization rotational element according to the first embodiment.

FIG. 2 is a schematic view illustrating another example of the spin-orbit-torque magnetization rotational element according to the present embodiment. A spin-orbit-torque magnetization rotational element 101 illustrated in FIG. 2 includes a first ferromagnetic layer 11, a spin-orbit-torque wiring 20, and an antiferromagnetic layer 31. The spin-orbit-torque magnetization rotational element 101 is different from the spin-orbit-torque magnetization rotational element 100 illustrated in FIG. 1 only in that an orientational direction of magnetization $M_{11}$ of the first ferromagnetic layer 11 and orientational directions of magnetizations $M_{31A}$, $M_{31B}$, $M_{31C}$ and $M_{31D}$ of the antiferromagnetic layer 31 are a y direction.

In the spin-orbit-torque magnetization rotational element 101 illustrated in FIG. 2, directions (±y directions) of a spin injected into the first ferromagnetic layer 11 are matched with magnetization rotations (±y directions) of the magnetization $M_{11}$ of the first ferromagnetic layer 11 by first, second and third functions. The spin injected into the first ferromagnetic layer 11 gives a torque in a direction in which it is reversed with respect to the magnetization $M_{11}$ of the first ferromagnetic layer 11 by 180°. That is, a great torque can be given by the magnetization $M_{11}$ of the first ferromagnetic layer 11.

On the other hand, in terms of a reaction speed of magnetization rotation, the spin-orbit-torque magnetization rotational element 100 illustrated in FIG. 1 is excellent. This is because the directions (±y directions) of the spin injected into the first ferromagnetic layer 10 are different from the magnetization rotations (±x directions) of the magnetization $M_{10}$ of the first ferromagnetic layer 10 by the first, second and third functions.

Figure 3:
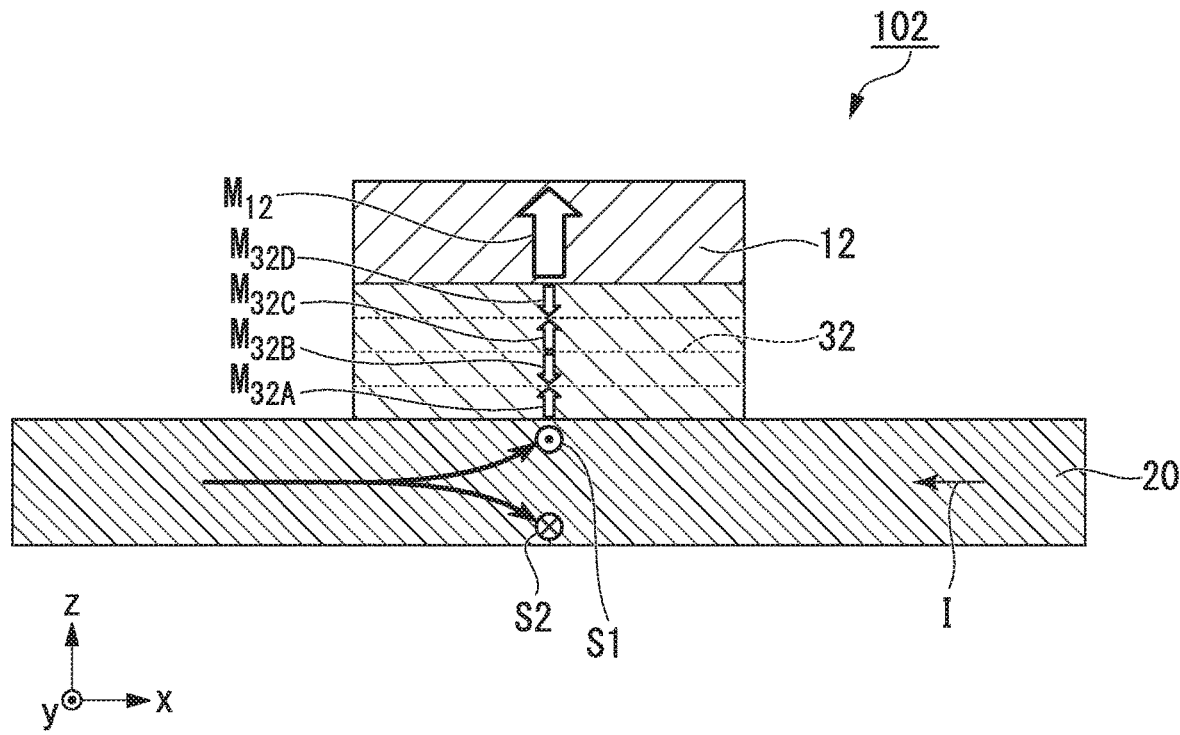
FIG. 3 is a schematic sectional view illustrating yet another example of the spin-orbit-torque magnetization rotational element according to the first embodiment.

FIG. 3 is a schematic view illustrating another example of the spin-orbit-torque magnetization rotational element according to the present embodiment. A spin-orbit-torque magnetization rotational element 102 illustrated in FIG. 3 includes a first ferromagnetic layer 12, a spin-orbit-torque wiring 20, and an antiferromagnetic layer 32. An easy axis of magnetization of the first ferromagnetic layer 12 is a lamination direction. Magnetizations $M_{32A}$, $M_{32B}$, $M_{32C}$ and $M_{32D}$ of the antiferromagnetic layer 32 and magnetization $M_{12}$ of the first ferromagnetic layer 12 exhibit exchange anisotropy in the lamination direction. The spin-orbit-torque magnetization rotational element 102 is different from the spin-orbit-torque magnetization rotational element 100 illustrated in FIG. 1 only in that an orientational direction of magnetization $M_{12}$ of the first ferromagnetic layer 12 and orientational directions of magnetizations $M_{32A}$, $M_{32B}$, $M_{32C}$ and $M_{32D}$ of the antiferromagnetic layer 32 are a z direction.

Even in a case where the first ferromagnetic layer 12 is a vertical magnetization film, the same effect as that of the spin-orbit-torque magnetization rotational element 100 illustrated in FIG. 1 is exhibited. In the case where the first ferromagnetic layer 12 is the vertical magnetization film, a write density can be increased even in the same element area.

Figure 4:
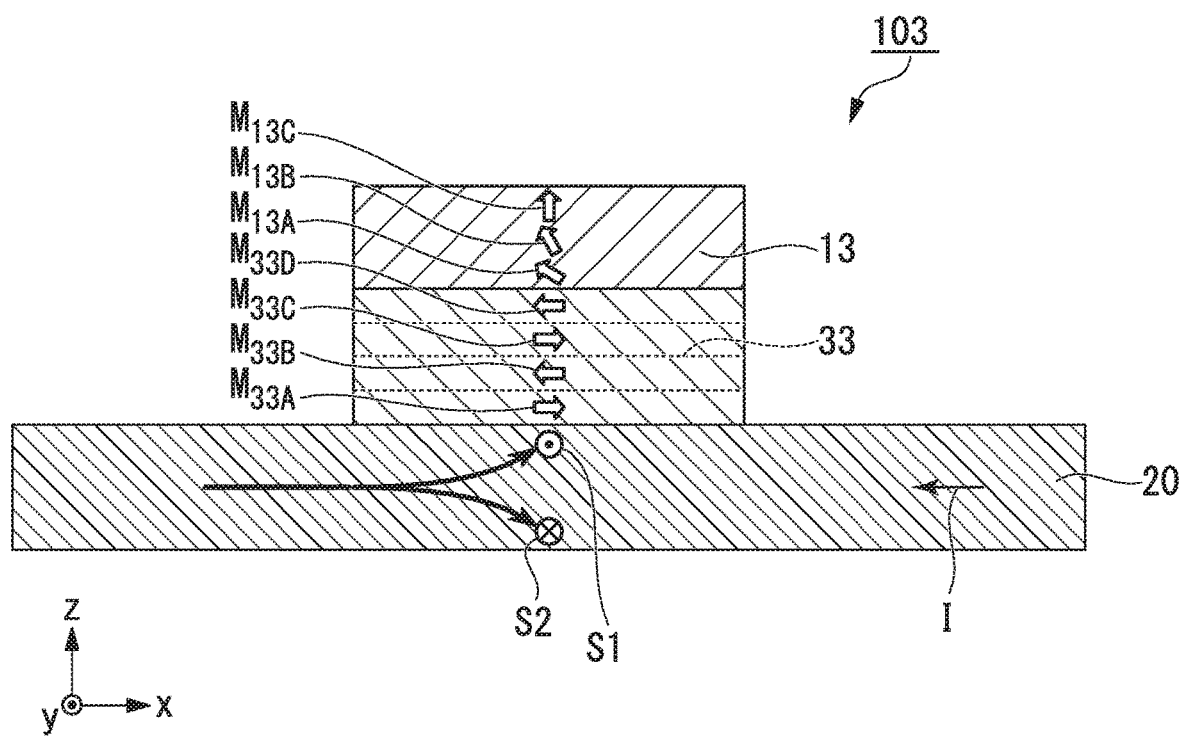
FIG. 4 is a schematic sectional view illustrating still yet another example of the spin-orbit-torque magnetization rotational element according to the first embodiment.

FIG. 4 is a schematic view illustrating another example of the spin-orbit-torque magnetization rotational element according to the present embodiment. A spin-orbit-torque magnetization rotational element 103 illustrated in FIG. 4 includes a first ferromagnetic layer 13, a spin-orbit-torque wiring 20, and an antiferromagnetic layer 33. Portions of the magnetization $M_{13A}$, $M_{13B}$ and $M_{13C}$ of the first ferromagnetic layer 13 are oriented in the in-plane direction and the lamination direction in a state where no external force is applied. The spin-orbit-torque magnetization rotational element 103 is different from the spin-orbit-torque magnetization rotational element 100 illustrated in FIG. 1 in that the first ferromagnetic layer 13 is a vertical magnetization film.

When some of the magnetizations $M_{13A}$, $M_{13B}$ and $M_{13C}$ of the first ferromagnetic layer 13 are oriented in the in-plane and lamination directions in the state where no external force is applied (in FIG. 4, the magnetizations $M_{13B}$ and $M_{13C}$ are oriented in the in-plane direction and the lamination direction), there is an advantage that an energy barrier of magnetization reversal can be reduced and the magnetization reversal can occur at a higher speed.

All the spin-orbit-torque magnetization rotational elements 101, 102 and 103 illustrated in FIGS. 2 to 4 include the antiferromagnetic layers 31, 32 and 33 between the first ferromagnetic layers 11, 12 and 13 and the spin-orbit-torque wiring 20. For this reason, the spin-orbit-torque magnetization rotational elements 101, 102 and 103 can reduce a time required for magnetization rotation.

As will be described below, the spin current magnetization rotational element according to the present embodiment can be applied to a magnetoresistance effect element. However, the spin current magnetization rotational element is not limited to a magnetoresistance effect element as a use, and can also be applied to another use. As the other use, for example, the spin current magnetization rotational element can also be used in a spatial light modulator in which the spin current magnetization rotational element is arranged in each pixel and incident light is spatially modulated using a magneto-optical effect and, to avoid a hysteresis effect caused by a coercivity of a magnet in a magnetic sensor, a magnetic field applied to an easy axis of magnetization of the magnet may be replaced by a spin-orbit torque (SOT). In a case where magnetization is reversed, the spin current magnetization rotational element can be especially called a spin current magnetization reversal element.

Second Embodiment

<Spin-Orbit-Torque Magnetoresistance Effect Element>

Figure 5:
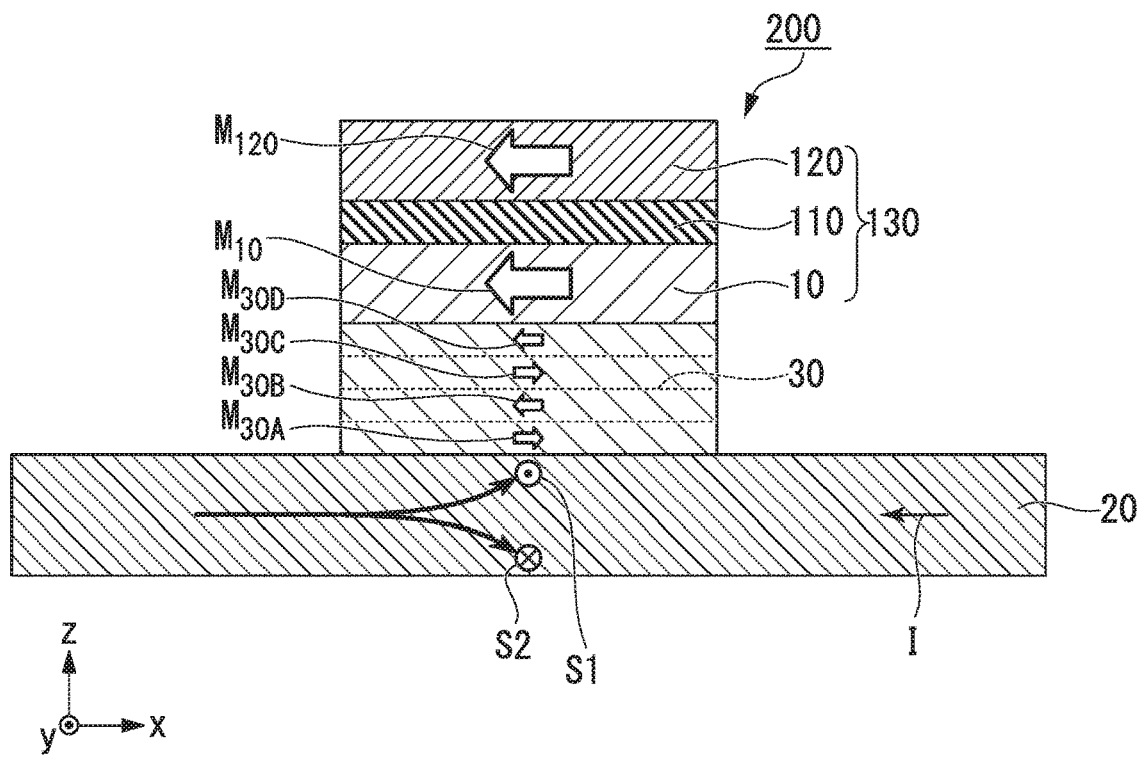
FIG. 5 is a schematic sectional view illustrating a spin-orbit-torque magnetoresistance effect element according to a second embodiment.

FIG. 5 is a schematic sectional view illustrating a spin-orbit-torque magnetoresistance effect element 200 according to a second embodiment. The spin-orbit-torque magnetoresistance effect element 200 illustrated in FIG. 5 includes a spin-orbit-torque magnetization rotational element 100, a nonmagnetic layer 110, and a second ferromagnetic layer 120. In FIG. 5, the spin-orbit-torque magnetization rotational element 100 according to the first embodiment is used as the spin-orbit-torque magnetization rotational element 100, but the spin-orbit-torque magnetization rotational elements 101, 102 and 103 may be used. Description of the same constitution of the spin-orbit-torque magnetization rotational element 100 of the first embodiment will be omitted.

A laminate (a functional part 130) in which a first ferromagnetic layer 10, the nonmagnetic layer 110, and the second ferromagnetic layer 120 are laminated functions similarly to an ordinary magnetoresistance effect element. Magnetization $M_{120}$ of the second ferromagnetic layer 120 is fixed in one direction (a −x direction), and a direction of magnetization $M_{10}$ of the first ferromagnetic layer 10 varies relatively, so that the functional part 130 functions. In a case where the functional part 130 is applied to an MRAM of a coerceivity difference type (a pseudo spin valve type), a coerceivity of the second ferromagnetic layer 120 is made greater than that of the first ferromagnetic layer 10. In a case where the functional part 130 is applied to an MRAM of an exchange bias type (a spin valve type), the magnetization $M_{120}$ of the second ferromagnetic layer 120 is fixed by exchange coupling with an antiferromagnetic layer.

Further, the functional part 130 has the same constitution as a tunneling magnetoresistance (TMR) element in a case where the nonmagnetic layer 110 in the functional part 130 is formed of an insulator, and as a giant magnetoresistance (GMR) element in a case where the nonmagnetic layer 110 is formed of a metal.

A lamination constitution of the functional part 130 may adopt that of a well-known magnetoresistance effect element. For example, each layer may be made up of a plurality of layers, or may include another layer such as an antiferromagnetic layer for fixing a magnetization direction of the second ferromagnetic layer 120. The second ferromagnetic layer 120 is called a fixed layer or a reference layer, and the first ferromagnetic layer 10 is called a free layer or a storage layer.

A well-known material can be used for a material of the second ferromagnetic layer 120. For example, a metal selected from the group consisting of Cr, Mn, Co, Fe, and Ni and an alloy that includes one or more of these metals and exhibits ferromagnetism may be used. An alloy that includes these metals and at least one or more of B, C, and N may be used. To be specific, the alloy may include Co—Fe or Co—Fe—B. Further, a Heusler alloy such as $Co_2FeSi$ may be used for the second ferromagnetic layer 120.

To further increase a coercivity of the second ferromagnetic layer 120 against the first ferromagnetic layer 10, an antiferromagnetic material such as IrMn, PtMn, or the like may be used as a material that is in contact with the second ferromagnetic layer 120. Furthermore, to prevent a leakage magnetic field of the second ferromagnetic layer 120 from affecting the first ferromagnetic layer 10, a structure of synthetic ferromagnetic coupling may be used.

A well-known material can be used for the nonmagnetic layer 110.

For example, in a case where the nonmagnetic layer 110 is formed of an insulator (in a case where the nonmagnetic layer 110 is a tunneling barrier layer), $Al_2O_3$, $SiO_2$, MgO, and $MgAl_2O_4$ may be used as a material thereof. In addition to them, materials obtained by substituting Zn, Be, or the like for some of Al, Si, and Mg may also be used. Among them, MgO or $MgAl_2O_4$ is a material in which coherent tunneling can be realized, and thus a spin can be efficiently injected. In a case where the nonmagnetic layer 110 is formed of a metal, Cu, Au, Ag, and the like may be used as a material thereof. Furthermore, in a case where the nonmagnetic layer 110 is formed of a semiconductor, Si, Ge, $CuInSe_2$, $CuGaSe_2$, Cu(In, Ga)$Se_2$ and the like may be used as a material thereof.

The functional part 130 may have another layer. For example, the functional part 130 may have a cap layer on a surface of the second ferromagnetic layer 120 which is located on the opposite side of the nonmagnetic layer 110.

The spin-orbit-torque magnetoresistance effect element 200 according to the second embodiment can perform writing/reading of data using a change in a resistance value of the functional part 130 caused by a difference in relative angle between the magnetization $M_{10}$ of the first ferromagnetic layer 10 and the magnetization $M_{120}$ of the second ferromagnetic layer 120. Since the magnetizations $M_{30A}$, $M_{30B}$, $M_{30C}$ and $M_{30D}$ constituting the antiferromagnetic layer 30 are subjected to magnetization rotation at a high speed, the spin-orbit-torque magnetoresistance effect element 200 according to the second embodiment can write data at a high speed.

Third Embodiment

<Magnetic Memory>

Figure 6:
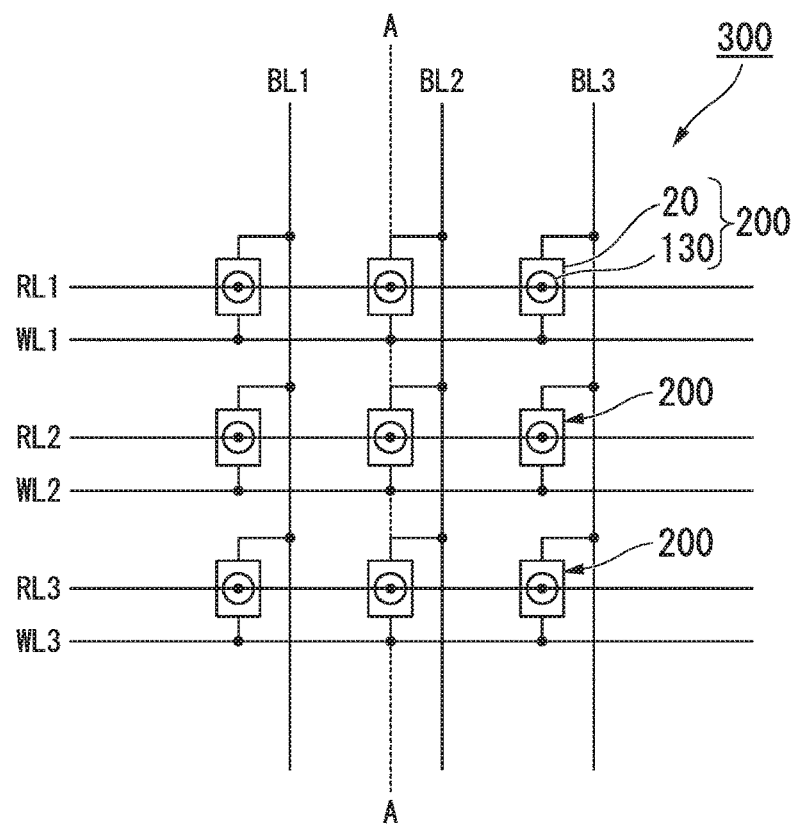
FIG. 6 is a view schematically illustrating a magnetic memory according to a third embodiment.

FIG. 6 is a top view of a magnetic memory 300 having a plurality of spin-orbit-torque magnetoresistance effect elements 200 (see FIG. 5). FIG. 5 corresponds to a sectional view obtained by cutting the spin-orbit-torque magnetoresistance effect element 200 along plane A-A of FIG. 6. The magnetic memory 300 illustrated in FIG. 6 has a matrix array of 3×3 spin-orbit-torque magnetoresistance effect elements 200. FIG. 6 is an example of the magnetic memory, and the number and array of spin-orbit-torque magnetoresistance effect elements 200 are arbitrary.

One of word lines WL1 to WL3, one of bit lines BL1 to BL3, and one of read lines RL1 to RL3 are connected to each of the spin-orbit-torque magnetoresistance effect elements 200.

By selecting the word lines WL1 to WL3 and the bit lines BL1 to BL3 to which a current is applied, the current flows to the spin-orbit-torque wiring 20 of any spin-orbit-torque magnetoresistance effect element 200, and a writing operation is performed. Further, by selecting the word lines WL1 to WL3 and the bit lines BL1 to BL3 to which a current is applied, the current flows in a lamination direction of any spin-orbit-torque magnetoresistance effect element 200, and a reading operation is performed. The word lines WL1 to WL3, the bit lines BL1 to BL3, and the read lines RL1 to RL3 to which a current is applied can be selected by a transistor or the like. That is, data of any spin-orbit-torque magnetoresistance effect element is read out of the plurality of spin-orbit-torque magnetoresistance effect elements 200, so that utilization as the magnetic memory is possible.

Fourth Embodiment

<Oscillator>

An oscillator according to the present embodiment has the same constitution as the spin-orbit-torque magnetization rotational element 100 illustrated in FIG. 1.

When a high-frequency current flows to the spin-orbit-torque wiring 20, a spin current is induced, and a spin is injected into the antiferromagnetic layer 30. Magnetization reversal of the antiferromagnetic layer 30 is transmitted to the first ferromagnetic layer 10 by magnetic coupling, and the magnetization $M_{10}$ of the first ferromagnetic layer 10 vibrates. Since the magnetization rotation of the antiferromagnetic layer 30 is a high speed, the magnetization $M_{10}$ of the first ferromagnetic layer 10 vibrates at a high speed (a frequency of THz).

When the magnetization $M_{10}$ vibrates at a high speed, a high frequency such as a THz wave oscillates. In a case where a frequency of an input high-frequency current is a ferromagnetic resonant frequency, the first ferromagnetic layer 10 is subjected to ferromagnetic resonance, and a large high frequency oscillates.

Further, the oscillator may have the same constitution as the spin-orbit-torque magnetoresistance effect element 200 as illustrated in FIG. 5. When a direct current is applied in the lamination direction of the functional part 130 in a state where the magnetization $M_{10}$ vibrates at a high speed, a high frequency can be read out as a signal of the resistance value change.

While preferred embodiments of the present disclosure have been described in detail, the present disclosure is not limited to a specific embodiment, and can be modified and changed in various ways without departing from the gist of the present disclosure defined by the claims.

EXPLANATION OF REFERENCES 10, 11, 12, 13: First ferromagnetic layer
20: Spin-orbit-torque wiring
30, 31, 32, 33: Antiferromagnetic layer
100, 101, 102, 103: Spin-orbit-torque magnetization rotational element
110: Nonmagnetic layer
120: Second ferromagnetic layer
130: Functional part
200: Spin-orbit-torque magnetoresistance effect element
300: Magnetic memory
$M_{10}$, $M_{11}$, $M_{12}$, $M_{13A}$, $M_{13B}$, $M_{13C}$, $M_{30A}$, $M_{30B}$, $M_{30C}$, $M_{30D}$, $M_{31A}$, $M_{31B}$, $M_{31C}$, $M_{31D}$, $M_{32A}$, $M_{32B}$, $M_{32C}$, $M_{32D}$, $M_{33A}$, $M_{33B}$, $M_{33C}$, $M_{33D}$, $M_{120}$: Magnetization

What is claimed is:

1. A spin-orbit-torque magnetization rotational element comprising:
   a spin-orbit-torque wiring extending in a first direction, wherein the spin-orbit-torque wiring produces a spin current due to a spin Hall effect when a current flows;
   an antiferromagnetic layer laminated on one surface of the spin-orbit-torque wiring; and
   a first ferromagnetic layer located on a side of the antiferromagnetic layer opposite to the spin-orbit-torque wiring and magnetically coupled with the antiferromagnetic layer by exchange coupling,
   wherein a length of the antiferromagnetic layer in the first direction is shorter than a length of the spin-orbit-torque wiring in the first direction.

2. The spin-orbit-torque magnetization rotational element according to claim 1, wherein:
   an easy axis of magnetization of the first ferromagnetic layer is an in-plane direction; and
   magnetizations of the antiferromagnetic layer and magnetization of the first ferromagnetic layer exhibit exchange anisotropy in the in-plane direction.

3. The spin-orbit-torque magnetization rotational element according to claim 1, wherein:
   an easy axis of magnetization of the first ferromagnetic layer is a lamination direction; and
   magnetizations of the antiferromagnetic layer and magnetization of the first ferromagnetic layer exhibit exchange anisotropy in the lamination direction.

4. The spin-orbit-torque magnetization rotational element according to claim 1, wherein portions of the magnetization of the antiferromagnetic layer are oriented in the in-plane direction and the lamination direction in a state where no external force is applied.

5. The spin-orbit-torque magnetization rotational element according to claim 1, wherein the antiferromagnetic layer includes any one selected from the group consisting of IrMn, PtMn, FeMn, and PdMn.

6. The spin-orbit-torque magnetization rotational element according to claim 2, wherein the antiferromagnetic layer includes any one selected from the group consisting of IrMn, PtMn, FeMn, and PdMn.

7. The spin-orbit-torque magnetization rotational element according to claim 3, wherein the antiferromagnetic layer includes any one selected from the group consisting of IrMn, PtMn, FeMn, and PdMn.

8. The spin-orbit-torque magnetization rotational element according to claim 4, wherein the antiferromagnetic layer includes any one selected from the group consisting of IrMn, PtMn, FeMn, and PdMn.

9. The spin-orbit-torque magnetization rotational element according to claim 1, wherein a film thickness of the antiferromagnetic layer is less than or equal to twice a spin diffusion length of the antiferromagnetic layer.

10. The spin-orbit-torque magnetization rotational element according to claim 2, wherein a film thickness of the antiferromagnetic layer is less than or equal to twice a spin diffusion length of the antiferromagnetic layer.

11. The spin-orbit-torque magnetization rotational element according to claim 3, wherein a film thickness of the antiferromagnetic layer is less than or equal to twice a spin diffusion length of the antiferromagnetic layer.

12. The spin-orbit-torque magnetization rotational element according to claim 4, wherein a film thickness of the antiferromagnetic layer is less than or equal to twice a spin diffusion length of the antiferromagnetic layer.

13. The spin-orbit-torque magnetization rotational element according to claim 5, wherein a film thickness of the antiferromagnetic layer is less than or equal to twice a spin diffusion length of the antiferromagnetic layer.

14. The spin-orbit-torque magnetization rotational element according to claim 6, wherein a film thickness of the antiferromagnetic layer is less than or equal to twice a spin diffusion length of the antiferromagnetic layer.

15. The spin-orbit-torque magnetization rotational element according to claim 7, wherein a film thickness of the antiferromagnetic layer is less than or equal to twice a spin diffusion length of the antiferromagnetic layer.

16. The spin-orbit-torque magnetization rotational element according to claim 8, wherein a film thickness of the antiferromagnetic layer is less than or equal to twice a spin diffusion length of the antiferromagnetic layer.

17. The spin-orbit-torque magnetization rotational element according to claim 1, wherein the spin-orbit-torque wiring includes a nonmagnetic metal whose atomic number is greater than or equal to atomic number 39 with d and f electrons in an outermost shell.

18. A spin-orbit-torque magnetoresistance effect element comprising:
- the spin-orbit-torque magnetization rotational element according to claim 1;
- a second ferromagnetic layer configured to face the first ferromagnetic layer; and
- a nonmagnetic layer located between the first ferromagnetic layer and the second ferromagnetic layer.

19. A magnetic memory comprising a plurality of spin-orbit-torque magnetoresistance effect elements, each of which is the spin-orbit-torque magnetoresistance effect element according to claim 18.

20. An oscillator comprising the spin-orbit-torque magnetization rotational element according to claim 1.

* * * * *